(12) United States Patent
Noyori et al.

(10) Patent No.: US 11,220,750 B2
(45) Date of Patent: Jan. 11, 2022

(54) SHOWER HEAD AND PROCESSING DEVICE

(71) Applicant: MEIDENSHA CORPORATION, Tokyo (JP)

(72) Inventors: Takeshi Noyori, Hamamatsu (JP); Yoshiki Morikawa, Shizuoka (JP); Toshinori Miura, Chiba (JP)

(73) Assignee: MEIDENSHA CORPORATION, Tokyo (JP)

( * ) Notice: Subject to any disclaimer, the term of this patent is extended or adjusted under 35 U.S.C. 154(b) by 0 days.

(21) Appl. No.: 17/254,481

(22) PCT Filed: Feb. 20, 2019

(86) PCT No.: PCT/JP2019/006199
§ 371 (c)(1),
(2) Date: Dec. 21, 2020

(87) PCT Pub. No.: WO2020/003591
PCT Pub. Date: Jan. 2, 2020

(65) Prior Publication Data
US 2021/0222299 A1 Jul. 22, 2021

(30) Foreign Application Priority Data

Jun. 28, 2018 (JP) .............................. JP2018-122566

(51) Int. Cl.
*C23C 16/40* (2006.01)
*C23C 16/455* (2006.01)

(52) U.S. Cl.
CPC .............................. *C23C 16/45565* (2013.01)

(58) Field of Classification Search
CPC ............ C23C 16/45565; C23C 16/455; H01L 21/3065; H01L 21/31; H01L 21/027; H01L 21/67017
(Continued)

(56) References Cited

U.S. PATENT DOCUMENTS 5,210,055 A 5/1993 Nakaguma et al.
5,605,637 A * 2/1997 Shan .................. H01J 37/32477
118/723 E
(Continued)

FOREIGN PATENT DOCUMENTS

JP 4-23429 A 1/1992
JP 08-335576 A 12/1996
(Continued)

*Primary Examiner* — Rudy Zervigon
(74) *Attorney, Agent, or Firm* — Foley & Lardner LLP

(57) ABSTRACT

An ozone processing device has a processing chamber in which a wafer is disposed, and a shower head in the processing chamber. The shower head is away from the surface to be processed of the wafer and facing the wafer. The surface of the shower head which faces the wafer has gas injection holes from which a gas to be supplied to the wafer and exhaust gas flow path portions that are areas in which the gas is not injected. An area in which the gas injection holes are formed is in the central part of the shower head, and a plurality of the exhaust gas flow path portions extending from the area toward the outer periphery of the shower head are arranged in the circumferential direction of the shower head. The gas injection holes are formed in each of areas disposed between the exhaust gas flow path portions.

7 Claims, 12 Drawing Sheets

(58) Field of Classification Search
USPC ......... 118/715, 728, 50; 156/345.29, 345.33, 156/345.34
See application file for complete search history.

(56) References Cited

U.S. PATENT DOCUMENTS

| | | | | |
|---|---|---|---|---|
| 5,788,799 | A * | 8/1998 | Steger | H01J 37/32357 156/345.37 |
| 5,891,350 | A * | 4/1999 | Shan | H01J 37/32834 216/71 |
| 5,950,925 | A * | 9/1999 | Fukunaga | C23C 16/45512 239/132.3 |
| 6,022,461 | A * | 2/2000 | Kobayashi | C23C 14/046 204/298.07 |
| 6,123,775 | A * | 9/2000 | Hao | H01L 21/67103 118/724 |
| 6,245,192 | B1 * | 6/2001 | Dhindsa | C23C 16/45572 156/345.34 |
| 6,261,408 | B1 * | 7/2001 | Schneider | C23C 16/4412 118/715 |
| 6,264,788 | B1 * | 7/2001 | Tomoyasu | H01J 37/32935 156/345.43 |
| 6,531,069 | B1 * | 3/2003 | Srivastava | H01J 37/3244 118/723 R |
| 6,733,620 | B1 * | 5/2004 | Sugiyama | H01J 37/32633 156/345.29 |
| 6,963,043 | B2 * | 11/2005 | Fink | H01J 37/32642 118/723 R |
| 7,109,660 | B2 * | 9/2006 | Ishihara | H01J 37/32633 315/111.11 |
| 7,273,526 | B2 * | 9/2007 | Shinriki | C23C 16/34 118/715 |
| 7,416,677 | B2 * | 8/2008 | Takahashi | H01J 37/32844 216/71 |
| 7,658,800 | B2 * | 2/2010 | Chen | C23C 16/45565 118/715 |
| 7,749,326 | B2 * | 7/2010 | Kim | C23C 16/45589 118/715 |
| 7,886,687 | B2 * | 2/2011 | Lee | H01L 21/67069 118/723 E |
| 8,069,817 | B2 * | 12/2011 | Fischer | C23C 16/45565 118/723 E |
| 8,075,728 | B2 * | 12/2011 | Balakrishna | H01J 37/3244 156/345.26 |
| 8,152,925 | B2 * | 4/2012 | Iizuka | H01L 21/67069 118/715 |
| 8,236,105 | B2 * | 8/2012 | Bera | H01L 21/67069 118/715 |
| 8,262,798 | B2 * | 9/2012 | Yamada | C23C 16/45572 118/724 |
| 8,298,338 | B2 * | 10/2012 | Kim | C23C 16/45591 118/715 |
| 8,444,926 | B2 * | 5/2013 | Fodor | C23C 16/46 422/241 |
| 8,506,713 | B2 * | 8/2013 | Takagi | C23C 16/45574 118/715 |
| 8,540,844 | B2 * | 9/2013 | Hudson | H01J 37/32082 156/345.43 |
| 8,597,462 | B2 * | 12/2013 | Brown | H01J 37/32623 156/345.37 |
| 8,747,610 | B2 * | 6/2014 | Chen | H01J 37/32504 156/345.39 |
| 8,771,417 | B2 * | 7/2014 | Yoon | H01J 37/32357 118/715 |
| 8,771,418 | B2 * | 7/2014 | Je | C23C 16/45565 118/715 |
| 8,790,489 | B2 * | 7/2014 | Honda | H01L 21/6719 156/345.29 |
| 9,121,097 | B2 * | 9/2015 | Mohn | H01J 37/3244 |
| 9,269,564 | B2 * | 2/2016 | Han | C23C 16/45563 |
| 9,540,731 | B2 * | 1/2017 | Noorbakhsh | H01J 37/32449 |
| 9,728,380 | B2 * | 8/2017 | Mohn | C23C 16/45565 |
| 9,732,424 | B2 * | 8/2017 | Lee | H01L 21/68771 |
| 9,837,250 | B2 * | 12/2017 | Huston | H01J 37/32522 |
| 10,145,012 | B2 * | 12/2018 | Je | C23C 16/52 |
| 10,240,231 | B2 * | 3/2019 | Du | C23C 16/4412 |
| 10,900,122 | B2 * | 1/2021 | Shugrue | C23C 16/45508 |
| 10,954,596 | B2 * | 3/2021 | Polyak | C23C 16/45565 |
| 2002/0038791 | A1 * | 4/2002 | Okumura | H01J 37/3244 216/71 |
| 2003/0037800 | A1 * | 2/2003 | Bailey | H01L 21/67069 134/1 |
| 2003/0037801 | A1 * | 2/2003 | Bailey | H01L 21/67069 134/1 |
| 2003/0092278 | A1 * | 5/2003 | Fink | H01J 37/32623 438/710 |
| 2004/0129218 | A1 * | 7/2004 | Takahashi | H01J 37/32834 118/715 |
| 2004/0262155 | A1 * | 12/2004 | Lombardi | H01J 37/32449 204/298.01 |
| 2005/0070105 | A1 * | 3/2005 | Bailey, III | H01L 21/7684 438/689 |
| 2005/0167052 | A1 * | 8/2005 | Ishihara | H01J 37/32633 156/345.47 |
| 2005/0224179 | A1 * | 10/2005 | Moon | H01J 37/32834 156/345.29 |
| 2007/0218702 | A1 * | 9/2007 | Shimizu | H01L 21/67161 438/758 |
| 2007/0266945 | A1 * | 11/2007 | Shuto | H01J 37/32091 118/723 E |
| 2007/0281106 | A1 * | 12/2007 | Lubomirsky | C23C 16/45502 427/569 |
| 2007/0289534 | A1 * | 12/2007 | Lubomirsky | C23C 16/45574 118/723 R |
| 2008/0035605 | A1 * | 2/2008 | Takahashi | H01J 37/32844 216/58 |
| 2008/0078746 | A1 * | 4/2008 | Masuda | H01L 21/3086 216/79 |
| 2008/0178805 | A1 * | 7/2008 | Paterson | H01J 37/32357 118/723 I |
| 2008/0196666 | A1 | 8/2008 | Toshima | |
| 2008/0236495 | A1 | 10/2008 | Tompa | |
| 2009/0061646 | A1 * | 3/2009 | Chiang | C23C 16/45548 438/763 |
| 2009/0156015 | A1 * | 6/2009 | Park | C23C 16/45519 438/758 |
| 2009/0159213 | A1 * | 6/2009 | Bera | H01J 37/3244 156/345.34 |
| 2009/0218043 | A1 * | 9/2009 | Balakrishna | H01J 37/3244 156/345.33 |
| 2009/0027521 | A1 | 11/2009 | Shanker et al. | |
| 2010/0136216 | A1 * | 6/2010 | Tsuei | H01L 31/1824 427/9 |
| 2010/0167551 | A1 * | 7/2010 | DeDontney | C23C 16/45578 438/758 |
| 2010/0190341 | A1 * | 7/2010 | Park | H01L 21/31612 438/694 |
| 2012/0000886 | A1 * | 1/2012 | Honda | H01J 37/32633 216/24 |
| 2012/0135145 | A1 * | 5/2012 | Je | C23C 16/45565 427/248.1 |
| 2012/0152171 | A1 * | 6/2012 | Lee | H01L 21/68764 118/730 |
| 2013/0171832 | A1 * | 7/2013 | French | C23C 16/04 438/758 |
| 2013/0276983 | A1 * | 10/2013 | Park | C23C 16/4585 156/345.34 |
| 2014/0061324 | A1 * | 3/2014 | Mohn | C23C 16/45565 239/1 |
| 2014/0224177 | A1 * | 8/2014 | Park | H01L 21/02104 118/730 |
| 2016/0289831 | A1 * | 10/2016 | Je | C23C 16/4412 |
| 2016/0289834 | A1 | 10/2016 | Je et al. | |
| 2017/0218515 | A1 | 8/2017 | Shin et al. | |
| 2019/0323126 | A1 * | 10/2019 | Sung | C23C 16/45565 |
| 2019/0382896 | A1 * | 12/2019 | Doering | C23C 16/4401 |
| 2020/0411337 | A1 * | 12/2020 | Lee | H01L 21/67103 |

(56) References Cited

U.S. PATENT DOCUMENTS

FOREIGN PATENT DOCUMENTS

| | | |
|---|---|---|
| JP | 2001-304756 A | 10/2001 |
| JP | 2003-20209 A | 1/2003 |
| JP | 2003-309075 A | 10/2003 |
| JP | 2008-205219 A | 9/2008 |
| JP | 2011-520035 A | 7/2011 |
| JP | 2017-501569 A | 1/2017 |

* cited by examiner

SHOWER HEAD AND PROCESSING DEVICE

TECHNICAL FIELD

The present invention relates to a shower head and a processing device equipped with the shower head, and particularly to a configuration of a shower head for supplying a gas to be used for reaction, such as a material gas, to an object to be processed.

BACKGROUND TECHNOLOGY

A shower head is provided in a processing device for carrying out, for example, CVD (Chemical Vapor Deposition) and ozone oxidation, and is configured to supply a gas to be used for reaction, such as a material gas, to an object to be processed, such as a wafer (for example, a patent document 1).

Gas injection holes are uniformly arranged on the surface of the shower head, and it can be considered that the gas to be injected from the gas injection holes is uniformly applied to the processing object, such as a wafer.

However, since the gas supplied to the processing object flows from the center toward the outer periphery of the processing object, the exhausting of the gas injected to the central part of the processing object is interfered by the gas injected to the peripheral part of the processing object. Therefore, as compared with the gas injected to the peripheral part of the processing object, the gas injected to the central part of the processing object is hard to be exhausted. As a result, the pressure difference is generated between in the central part and at the peripheral part on the surface of the processing object (pressure in the central part>pressure in the peripheral part), and the gas is hard to be supplied to the central part of the processing object and is easy to be supplied to the peripheral part of the processing object at which the exhausting is quickly carried out and the pressure is low.

In this way, when the deviation of the gas to be supply to the processing object occurs, there is possibility that the processing having excellent in uniformity cannot be carried out to the surface to be processed of the processing object.

PRIOR ART REFERENCES

Patent Documents

Patent Document 1: Japanese Patent Application Publication 2003-309075
Patent Document 2: Japanese Patent Application Publication 2003-020209

SUMMARY OF THE INVENTION

The present invention is made in consideration of such a situation, and an object of the present invention is to provide a technique for reducing the pressure difference between a shower head and an object to be processed in the horizontal direction of the surface to be processed of the processing object.

In one aspect of the shower head of the present invention to achieve the above object,
a shower head for supplying a gas to an object to be processed, includes:
a plurality of gas injection holes on a side facing the processing object of the shower head,
wherein a plurality of areas in which the gas is not injected are provided on a surface facing the processing object of the shower head so as to extend from an outer peripheral part of the shower head toward a central part of the shower head, and
wherein the gas injection holes are formed in each of areas disposed between the areas in which the gas is not injected.

In addition, according to another aspect of the shower head of the present invention to achieve the above object, in the above shower head,
the gas contains different kinds of a plurality of gasses, and
gas injection holes for supplying different kinds of the respective gasses are provided on the side facing the processing object of the shower head.

In addition, according to another aspect of the shower head of the present invention to achieve the above object, in the above shower head,
an exhaust direction control plate extending from an outer side of the shower head toward the central part of the shower head is vertically provided on the side facing the processing object of the shower head.

In addition, according to another aspect of the shower head of the present invention to achieve the above object, in the above shower head,
an exhaust characteristic control plate vertically provided along an outer periphery of the shower head is provided on the side facing the processing object of the shower head.

In addition, in one aspect of the processing device of the present invention to achieve the above object,
a processing device includes:
a processing chamber in which an object to be processed is disposed;
a stage which is provided in the processing chamber and on which the processing object is placed; and
a shower head for supplying a gas to the processing object, the shower head being provided so as to face the processing object placed on the stage,
wherein a plurality of areas in which the gas is not injected are provided on a surface facing the processing object of the shower head so as to extend from an outer peripheral part of the shower head toward a central part of the shower head, and
wherein a plurality of gas injection holes from which the gas is injected are formed in each of areas disposed between the areas in which the gas is not injected.

In addition, according to another aspect of the processing device of the present invention to achieve the above object, in the above processing device,
the gas contains different kinds of a plurality of gasses, and
gas injection holes for supplying different kinds of the respective gasses are provided on a side facing the processing object of the shower head.

In addition, according to another aspect of the processing device of the present invention to achieve the above object, in the above processing device,
an exhaust direction control plate extending from an outer side of the shower head toward the central part of the shower head is vertically provided on the side facing the processing object of the shower head.

In addition, according to another aspect of the processing device of the present invention to achieve the above object, in the above processing device,
an exhaust characteristic control plate vertically provided along an outer periphery of the shower head is provided to the shower head or the processing chamber.

In addition, according to another aspect of the processing device of the present invention to achieve the above object, in the above processing device, the surface on the side facing the processing object of the shower head has a circular shape, the processing chamber is provided with a plate formed with a slit from which the gas is exhausted, along the outer periphery of the shower head so as to face a side surface of the processing object, and the plate formed with the slit is rotatably supported about a center of the surface on the side facing the processing object of the shower head.

According to the above invention, the pressure difference between the shower head and the processing object in the horizontal direction of the processing surface of the processing object can be reduced.

MODE FOR IMPLEMENTING THE INVENTION

A shower head and a processing device according to an embodiment of the present invention will be explained in detail based on the drawings. In the explanation for an embodiment, the processing device is referred to as an ozone processing device.

Figure 1A:
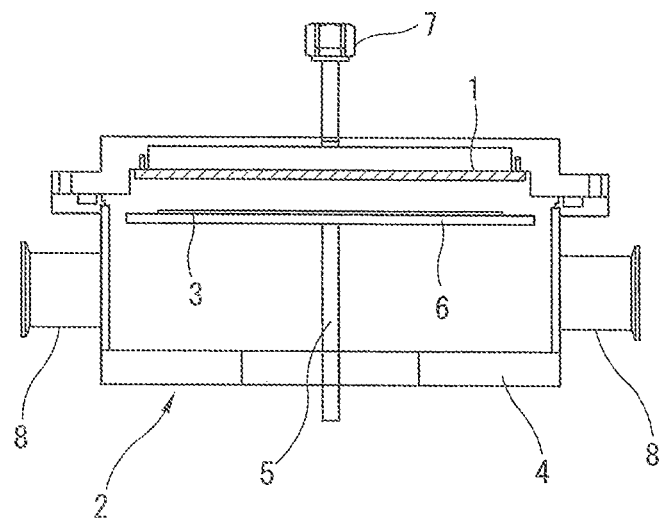
FIG. 1 (*a*) is a sectional view of an ozone processing device provided with a shower head according to a first embodiment of the present invention, and FIG. 1 (*b*) is a plane view of a shower head according to a first embodiment of the present invention.
Figure 1B:
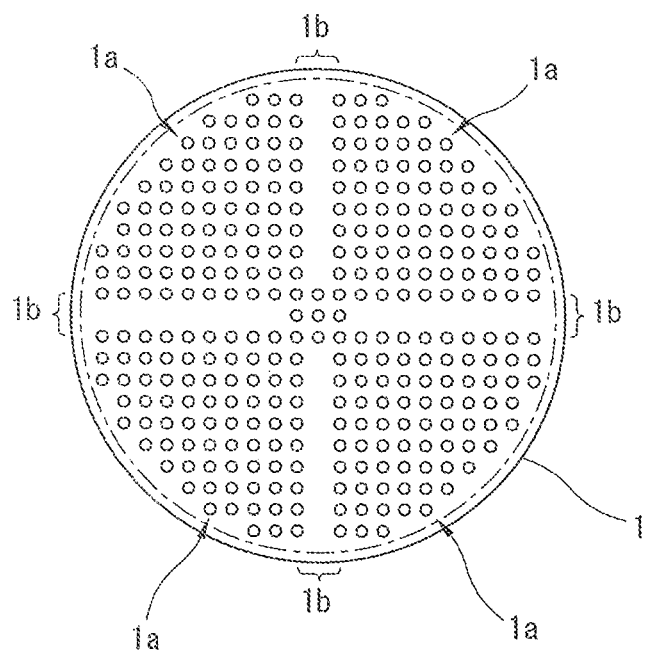

FIG. 1 is a sectional view of an ozone processing device 2 provided with a shower head 1 according to an embodiment of the present invention. The ozone processing device 2 is provided with a processing chamber 4 in which a wafer 3 as an object to be processed is disposed. The wafer 3 is placed on a rotation stage 6 (and a susceptor) supported on a rotation introducing machine 5. The susceptor is a wafer support equipped with, for example, a heater for heating the wafer 3.

A gas supply port 7 for supplying ozone that is a material gas is provided above the processing chamber 4. In addition, exhaust ports 8 from which gasses, such as ozone supplied to the wafer 3 and oxygen produced after processing, are exhausted are provided to the side portions of the processing chamber 4.

The shower head 1 is provided inside the processing chamber 4. The shower head 1 is provided at a position away from the surface to be processed of the wafer 3 so as to face the wafer 3.

As shown in FIG. 1 (*b*), gas injection holes 1*a* are formed on the surface of the shower head 1 which faces the wafer 3. In the explanation for the embodiments, although the gas injection holes 1*a* are formed so as to be arranged at equal intervals in the vertical and horizontal directions in the drawings, the arrangement form of the gas injection holes 1*a* can be arbitrary set. For example, the gas injection holes 1*a* can be arranged on concentric circles centering on the shower head 1 at equal intervals (except the after-mentioned exhaust gas flow path portions 1*b*). In addition, the shape of the surface of the shower head 1 which faces the wafer 3 is not limited to a circular shape, and, for example, it may be a rectangular shape.

Exhaust gas flow path portions 1*b* each extending from the outer peripheral part to the central part of the shower head 1 are provided to the surface of the shower head 1 which faces the wafer 3. The exhaust gas flow path portions 1*b* are areas in which gas is not injected. The exhaust gas flow path portions 1*b* are areas in which the gas injection holes 1*a* are not formed, and, for example, a plurality of the exhaust gas flow path portions 1*b* are arranged in the circumferential direction of the shower head 1 at equal intervals in the surface of the shower head 1 which faces the wafer 3. For example, an area in which the gas injection holes 1a are formed is provided in the central part of the shower head 1, and the exhaust gas flow path portions 1b extending from the outer peripheral end part of this area toward the outer periphery of the shower head 1 are provided. In addition, the gas injection holes 1a are formed in each of areas disposed between the exhaust gas flow path portions 1b. The width of each of the exhaust gas flow path portions 1b is set to be, for example, approximately 1.5 to 2 times greater than the shortest distance between gas injection holes 1a adjacent to each other. Since the exhaust gas flow path portions 1b are formed in the shower head 1, for example, even in a case where the shortest distance between adjacent gas injection holes 1a is greater than the distance between the gas injection surface of the shower head 1 and the surface of the wafer 3, exhaust flow paths having the same width as the exhaust gas flow path portions 1b are formed from the central part of the shower head 1 in the exhaust direction (radial direction of the wafer 3, in a case where the chamber has a cylindrical shape, and an exhaust port is provided right under the chamber).

The ozone gas supplied from the gas supply port 7 is supplied to the wafer 3 through the gas injection holes 1a of the shower head 1, and the oxidation processing of the wafer 3 is carried out. The ozone gas supplied to the wafer 3 (including decomposed gas after the reaction) flows toward the outer periphery of the shower head 1, then is discharged from the exhaust ports 8 to the outside of the processing chamber 4.

Although the concentration (volume %) of the ozone gas to be supplied to the ozone processing device 2 is not limited, for example, a high-concentration ozone gas having ozone concentration of 20 volume % or greater, preferably 80 volume % or greater is preferably used. The high-concentration ozone gas can be obtained by liquefying and separating only ozone from an ozone-contained gas based on a difference in vapor pressure, then vaporizing the ozone which has been liquefied again. The device for producing the high-concentration ozone gas is described in, for example, Japanese Patent Application Publication 2001-304756 and Japanese Patent Application Publication 2003-20209. The device for producing a high-concentration ozone gas produces a high-concentration ozone gas (ozone concentration≈100 vol %) by liquefying and separating only ozone based on a difference in vapor pressure between ozone and another gas (for example, oxygen). In particular, if a plurality of chambers for liquefying and vaporizing only ozone, the temperature of these chambers is controlled individually, and thereby a high-concentration ozone gas can be supplied continuously. In addition, as a device on the market for producing a high-concentration ozone gas, for example, a pure ozone generator (MPOG-HM1A1) made by MEIDENSHA CORPORATION can be used.

Figure 2:
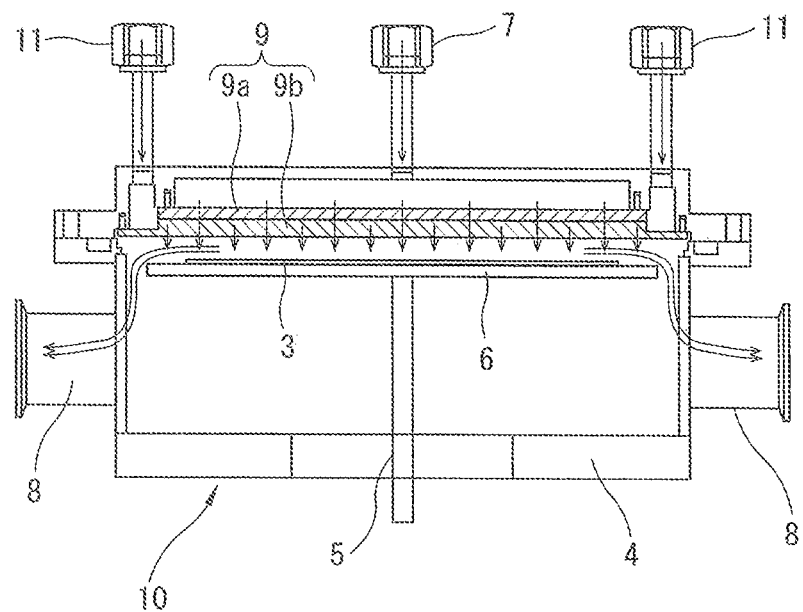
FIG. 2 is a sectional view of an ozone processing device provided with a shower head according to a second embodiment of the present invention.

FIG. 2 is a sectional view of an ozone processing device 10 provided with a shower head 9 according to a second embodiment of the present invention. In addition, in the explanation for the ozone processing device 10 and the shower head 9 according to the second embodiment of the present invention, the same symbols are applied to the same components when the components are the same as those in the ozone processing device 2 according to the first embodiment, and a detailed explanation is omitted. Similarly, in the explanation for third to eighth embodiments, the same symbols are applied to the same components when the components are the same as those in the previously described embodiments, and a detailed explanation is omitted.

The ozone processing device 10 according to the second embodiment of the present invention is provided with first and second gas injection holes 9e and 9f, from which different kinds of gasses are injected, on the side facing the wafer 3 of the shower head 9, such that two different kinds of gasses are supplied from the shower head 9 to the wafer 3.

The ozone processing device 10 is provided with a processing chamber 4. A rotation stage 6 and the shower head 9 are provided inside the processing chamber 4. In addition, a gas supply port 7 for supplying ozone gas and gas supply ports 11 for supplying an added gas (such as a TEOS gas and an unsaturated hydrocarbon gas) are provided above the processing chamber 4.

The shower head 9 is provided inside the processing chamber 4, and is provided at a position away from the wafer 3 placed on the rotation stage 6 so as to face the processing surface of the wafer 3. The shower head 9 is provided with a first shower head 9a and a second shower head 9b.

Figure 3A:
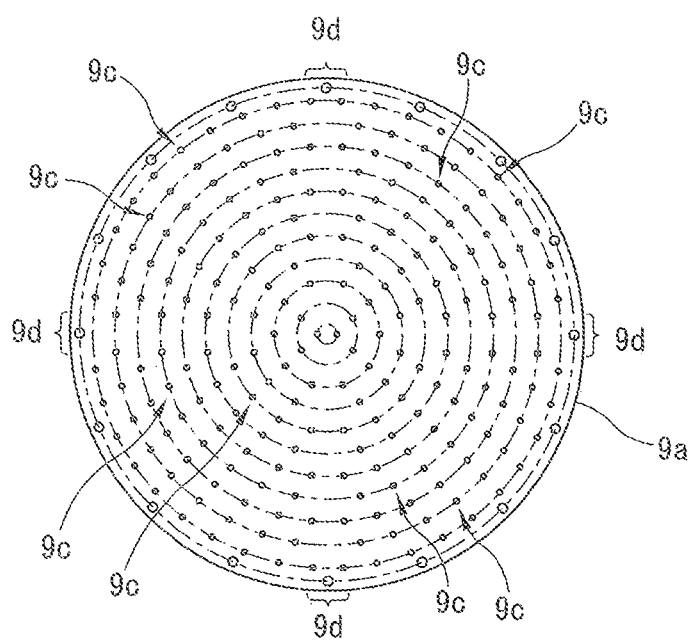
FIG. 3 (*a*) is a plane view of a first shower head, and FIG. 3 (*b*) is a side view of the first shower head.
Figure 3B:
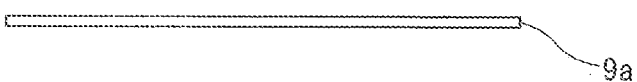

As shown in FIG. 3, similar to the shower head 1 explained in the first embodiment, the first shower head 9a is provided with, on a surface facing the wafer 3, gas injection holes 9c from which ozone gas as a material gas is injected and exhaust gas flow path portions 9d extending from the outer peripheral part to the central part of the first shower head 9a.

For example, the gas injection holes 9c are arranged on a plurality of concentric circles (except the exhaust gas flow path portions 9d) having different diameters at equal intervals, centering on the surface of the first shower head 9a which faces the wafer 3. In addition, the arrangement form of the gas injection holes 9c is not limited to the embodiment, and it can be arbitrary set.

The exhaust gas flow path portions 9d are areas in which gas is not injected. The exhaust gas flow path portions 9d are areas in which the gas injection holes 9c are not formed, and, for example, a plurality of the exhaust gas flow path portions 9d are arranged in the circumferential direction of the first shower head 9a at equal intervals in the surface of the first shower head 9a which faces the wafer 3. For example, an area in which the gas injection holes 9c are formed is provided in the central part of the first shower head 9a, and the exhaust gas flow path portions 9d extending from the outer peripheral end part of this area toward the outer periphery of the first shower head 9a are provided. In addition, the gas injection holes 9c are formed in each of areas disposed between the exhaust gas flow path portions 9d. The width of each of the exhaust gas flow path portions 9d is set to be, for example, approximately 1 to 2 times greater the distance between gas injection holes 9c adjacent to each other in the circumferential direction.

Figure 4A:
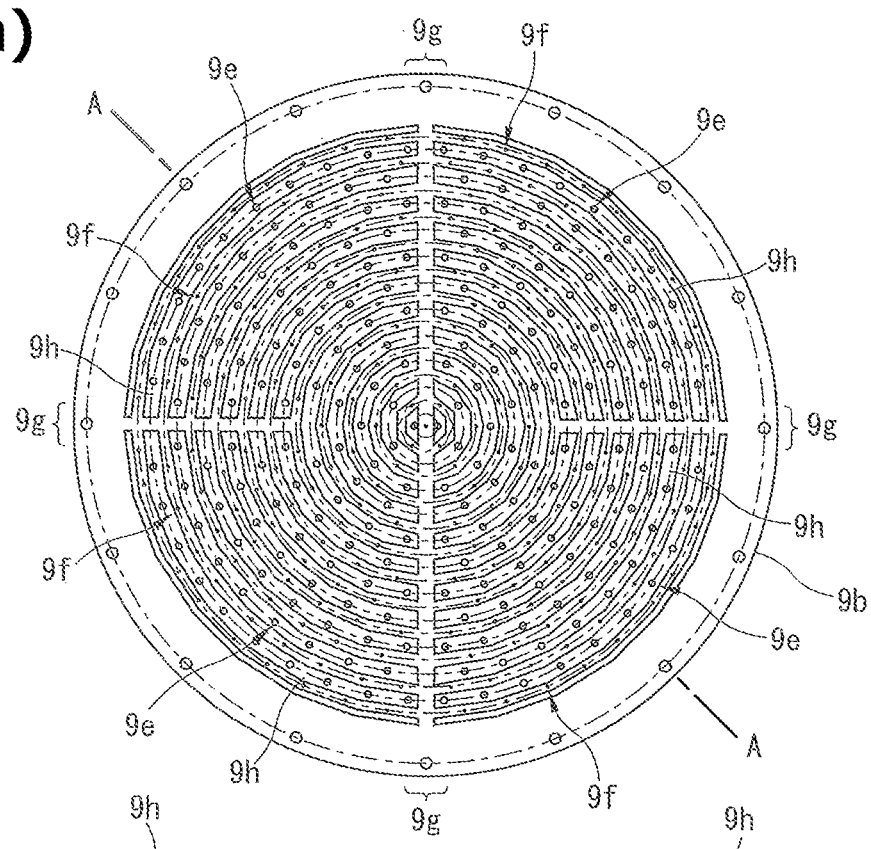
FIG. 4 (*a*) is a plane view of a second shower head, and FIG. 4 (*b*) is a sectional view of the second shower head which is taken along an A-A line.
Figure 4B:
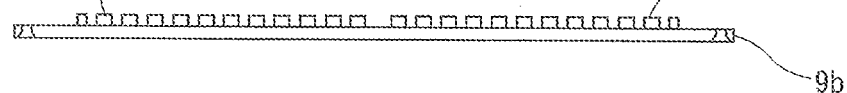

As shown in FIG. 4 (a), the second shower head 9b is provided with, on the surface facing the wafer 3, the first gas injection holes 9e communicating to the gas injection holes 9c of the first shower head 9a, the second gas injection holes 9f from which TEOS gas is injected, and exhaust gas flow path portions 9g extending from the outer peripheral part to the central part of the second shower head 9b.

The first gas injection holes 9e are formed so as to correspond to the gas injection holes 9c of the first shower head 9a. For example, the first gas injection holes 9e are arranged on concentric circles (except the exhaust gas flow path portions 9g) at equal intervals, centering on the surface of the second shower head 9b which faces the wafer 3.

For example, the second gas injection holes 9f are arranged on a plurality of concentric circles (except the exhaust gas flow path portions 9g) having different diameters at equal intervals, centering on the surface of the second shower head 9b which faces the wafer 3. The second gas injection holes 9f are arranged alternately with the first gas injection holes 9e with respect to the radial direction of the concentric circles on which the second gas injection holes 9f are disposed. The arrangement form of the second gas injection holes 9f is not limited to the embodiment, and it can be arbitrary arranged.

The exhaust gas flow path portions 9g are areas in which gas is not injected. The exhaust gas flow path portions 9g are areas in which the first and second gas injection holes 9e and 9f are not formed, and, for example, a plurality of the exhaust gas flow path portions 9g are arranged in the circumferential direction of the second shower head 9b at equal intervals in the surface of the second shower head 9b which faces the wafer 3. For example, an area in which the first and second gas injection holes 9e and 9f are formed is provided in the central part of the second shower head 9b, and the exhaust gas flow path portions 9g extending from the outer peripheral end part of this area toward the outer periphery of the second shower head 9b are provided. In addition, the first and second gas injection holes 9e and 9f are formed in each of areas disposed between the exhaust gas flow path portions 9g. The width of each of the exhaust gas flow path portions 9g is set to be, for example, approximately 1 to 2 times greater than the distance between first gas injection holes 9e (or second gas injection holes 9f) adjacent to each other in the circumferential direction, or approximately 1.5 to 2 times greater than the shortest distance between gas injection holes 9e and 9f adjacent to each other. Since the exhaust gas flow path portions 9g are formed in the second shower head 9b, for example, even in a case where the shortest distance between first and second gas injection holes 9e and 9f adjacent to each other is greater than the distance between the gas injection surface of the shower head 9 and the surface of the wafer 3, exhaust flow paths having the same width as the exhaust gas flow path portions 9g are formed from the central part of the shower head 9 in the exhaust direction (radial direction of the wafer 3, in a case where the chamber has a cylindrical shape and an exhaust port is provided right under the chamber).

As shown in FIG. 4 (b), protruding portions 9h protruding toward the first shower head 9a are formed on the surface of the second shower head 9b which faces the first shower head 9a. The protruding portions 9h are vertically provided (except in the areas in which the exhaust gas flow path portions 9g are formed) along the gas injection holes 9c of the first shower head 9a provided so as to face the second shower head 9b, and the first gas injection holes 9e are formed to the protruding portions 9h. In addition, as shown in FIG. 4 (a), by providing areas, in which the protruding portions 9h are not formed, along the radial direction of the second shower head 9b, these areas serve as supply flow paths for TEOS gas. Consequently, TEOS gas is supplied, to the wafer 3, from the second gas injection holes 9f formed in the central part of the second shower head 9b.

As shown in FIG. 2, the first shower head 9a and the second shower head 9b are provided to be superposed such that the surfaces from which gasses to be supplied to the wafer 3 are injected face the wafer 3. The ozone gas supplied from the gas supply port 7 is supplied to the wafer 3 through the gas injection holes 9c of the first shower head 9a and the first gas injection holes 9e of the second shower head 9b. TEOS gas supplied from the gas supply ports 11 is supplied from the second gas injection holes 9f to the wafer 3 through the space between the first shower head 9a and the second shower head 9b. That is, ozone gas and TEOS gas are mixed on the surface of the wafer 3, then are supplied to the wafer 3. Ozone gas and TEOS gas (containing reaction gasses, such as oxygen produced after the processing) supplied to the wafer 3 flow toward the outer periphery of the shower head 9, and then are exhausted from the exhaust ports 8 to the outside of the processing chamber 4.

Figure 5A:
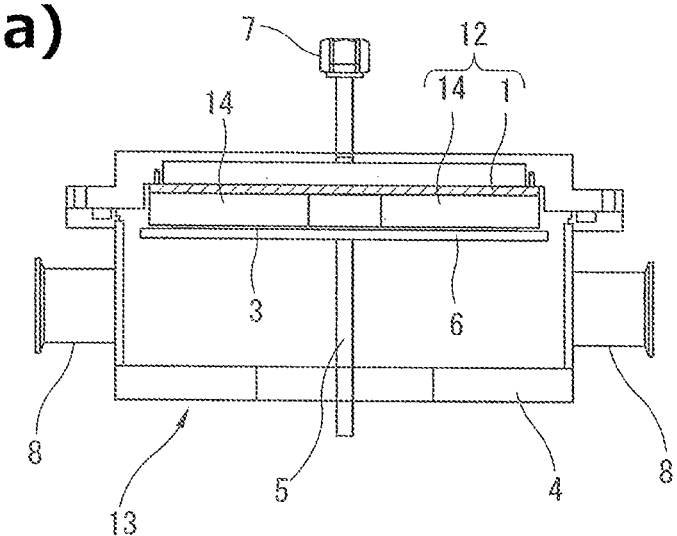
FIG. 5 (*a*) is a sectional view of an ozone processing device provided with a shower head according to a third embodiment of the present invention, FIG. 5 (*b*) is a plane view of a shower head according to a third embodiment of the present invention, and FIG. 5 (*c*) is a side view of the shower head.
Figure 5B:
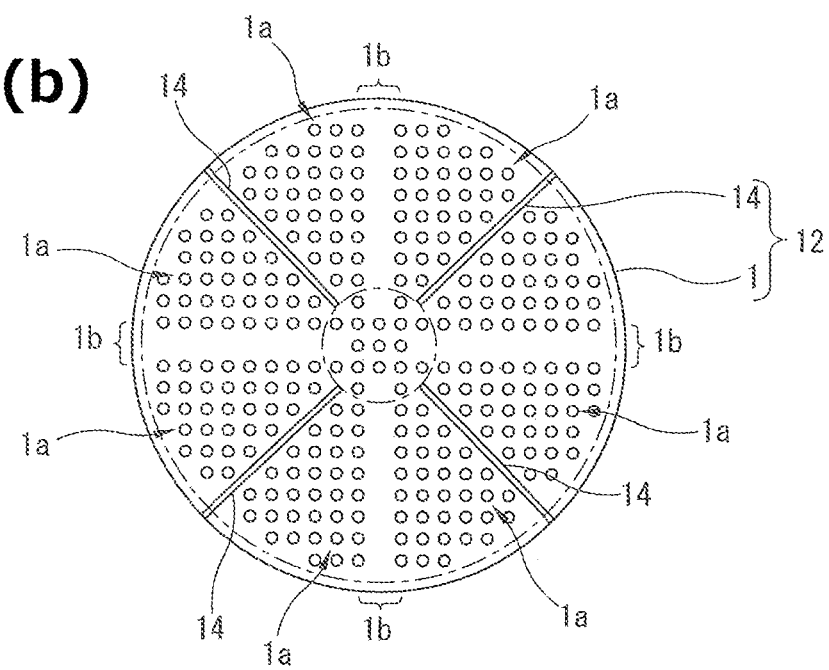
Figure 5C:
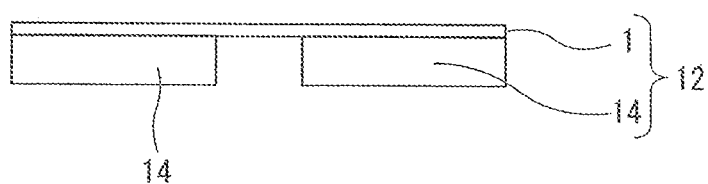

FIG. 5 (a) is a sectional view of an ozone processing device 13 provided with a shower head 12 according to a third embodiment of the present invention. The shower head 12 according to the third embodiment is one in which exhaust direction control plates 14 are provided to the shower head 1 according to the first embodiment. The configuration of the shower head 12 different from that of the shower head 1 according to the first embodiment will be explained in detail.

As shown in FIG. 5 (b) and FIG. 5 (c), each of the exhaust direction control plates 14 is a plate extending from the central part toward the outer periphery of the shower head 1, and provided vertically from the surface of the shower head 1 which faces the wafer 3 toward the wafer 3. For example, the exhaust direction control plates 14 are provided in the respective middle parts between exhaust gas flow path portions 1b adjacent to each other in the circumferential direction of the shower head 1.

According to the shower head 12 according to the third embodiment, in addition to the effect obtained in the shower head 1 according to the first embodiment, by providing the exhaust direction control plates 14, the gas injected from the gas injection holes 1a of the shower head 1 can be quickly exhausted from a radially closest exhaust gas flow path portion 1b.

Figure 6A:
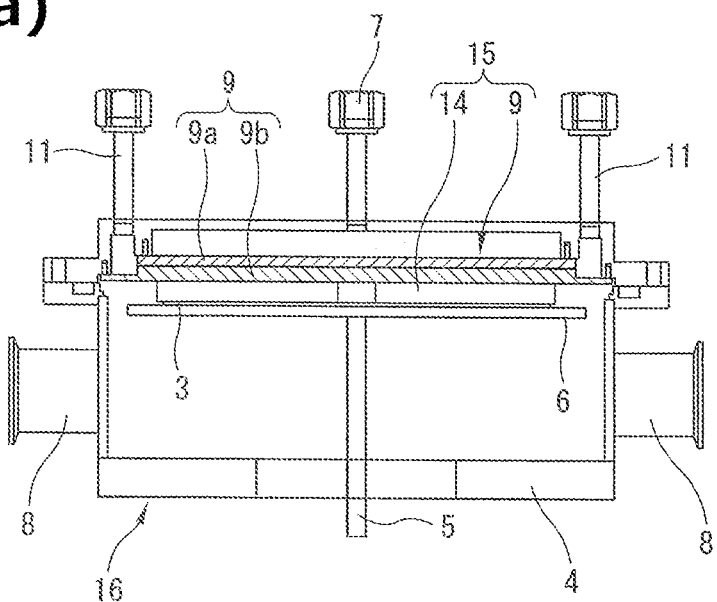
FIG. 6 (*a*) is a sectional view of an ozone processing device provided with a shower head according to a fourth embodiment of the present invention, FIG. 6 (*b*) is a plane view of a shower head according to a fourth embodiment of the present invention, and FIG. 6 (*c*) is a sectional view of the shower head (second shower head) which is taken along a B-B line.
Figure 6B:
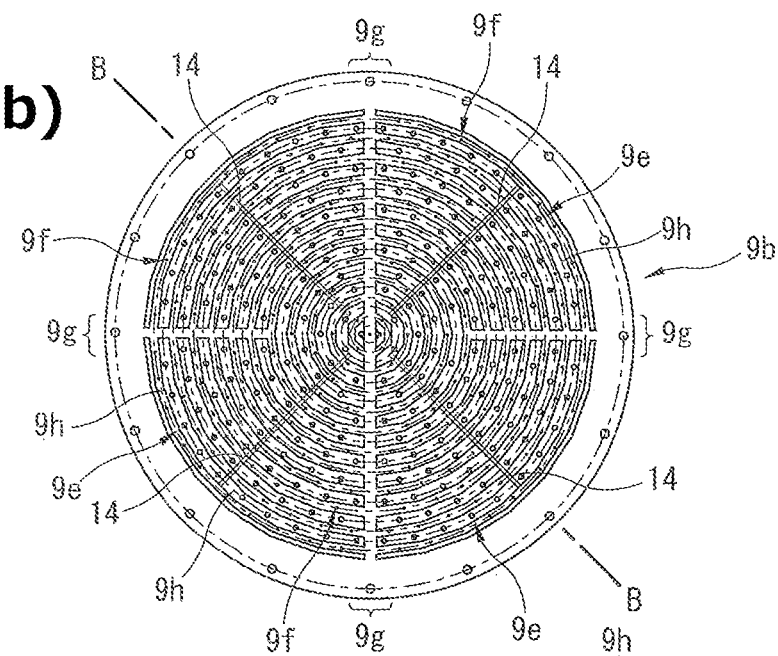
Figure 6C:
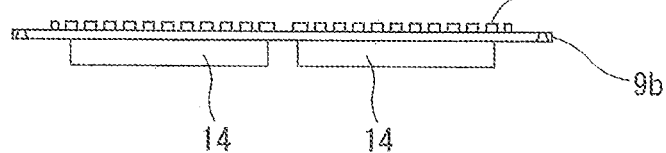

FIG. 6 (a) is a sectional view of an ozone processing device 16 provided with a shower head 15 according to a fourth embodiment of the present invention. The shower head 15 according to the fourth embodiment is one in which exhaust direction control plates 14 similar to those in the third embodiment are provided to the shower head 9 according to the second embodiment.

For example, each of the exhaust direction control plates 14 is provided vertically from the surface of the shower head 9 which faces the wafer 3. The exhaust direction control plates 14 are provided in the respective middle parts between exhaust gas flow path portions 9g adjacent to each other in the circumferential direction of the shower head 9.

According to the shower head 15 according to the fourth embodiment, in addition to the effect obtained in the shower head 9 according to the second embodiment, by providing the exhaust direction control plates 14, the gasses injected from the first gas injection holes 9e and the second gas injection holes 9f of the shower head 9 can be quickly exhausted from a radially closest exhaust gas flow path portion 9g.

Figure 7A:
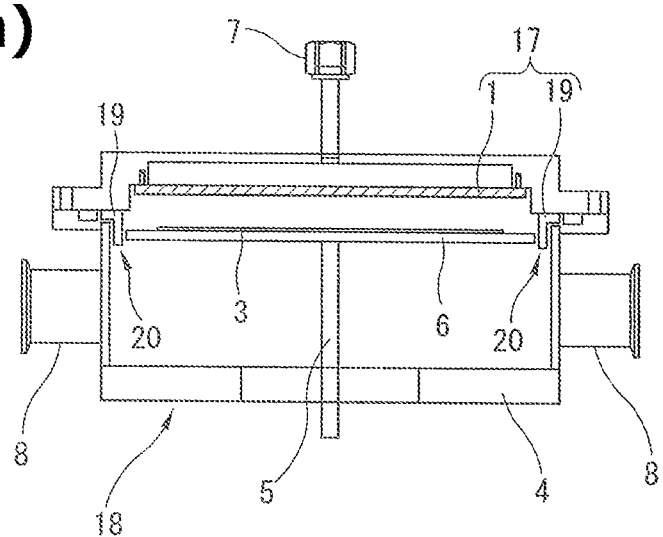
FIG. 7 (*a*) is a sectional view of an ozone processing device provided with a shower head according to a fifth embodiment of the present invention, FIG. 7 (*b*) is a plane view of an exhaust characteristic control plate, and FIG. 7 (*c*) is a longitudinal sectional view of the exhaust characteristic control plate.
Figure 7B:
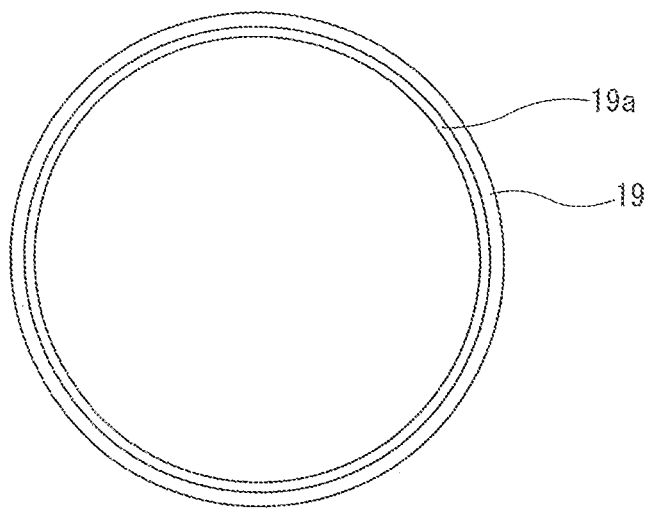
Figure 7C:
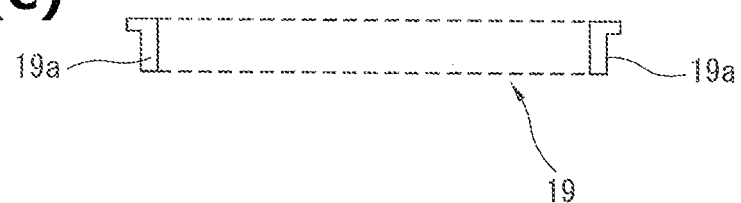

FIG. 7 (a) is a sectional view of an ozone processing device 18 provided with a shower head 17 according to a fifth embodiment of the present invention. The shower head 17 according to the fifth embodiment is one in which an exhaust characteristic control plate 19 is provided to the outer peripheral portion of the shower head 1 according to the first embodiment. The configuration of the shower head 17 different from that of the shower head 1 according to the first embodiment will be explained in detail.

For example, the exhaust characteristic control plate 19 is provided to the ceiling part of the processing chamber 4 so as to cover the outer periphery of the shower head 1. In addition, the shower head 17 may be configured by directly providing the exhaust characteristic control plate 19 to the outer peripheral portion of the shower head 1.

As shown in FIG. 7 (b) and FIG. 7 (c), the exhaust characteristic control plate 19 is a ring-shaped member including a wall portion 19a extending in the normal direction of the gas injection surface of the shower head 17.

The projecting length of the wall portion 19a is appropriately set in accordance with the pressure between the shower head 17 and the wafer 3. A space part 20 from which the gas supplied to the wafer 3 is exhausted is provided between the inner peripheral surface of the wall portion 19a (or the distal end portion of the wall portion 19a) and the side part of the wafer 3 or the rotation stage 6. The ozone gas supplied from the shower head 17 is exhausted from the exhaust ports 8 to the outside of the processing chamber 4 through the space part 20. Although the exhaust characteristic of the gas supplied to the wafer 3 deteriorates when the exhaust characteristic control plate 19 is provided, the pressure on the whole surface of the wafer 3 can be equalized.

According to the shower head 17 according to the fifth embodiment, in addition to the effect obtained in the shower head 1 according to the first embodiment, by providing the exhaust characteristic control plate 19, the pressure on the whole surface of the wafer 3 can be further equalized.

Figure 8:
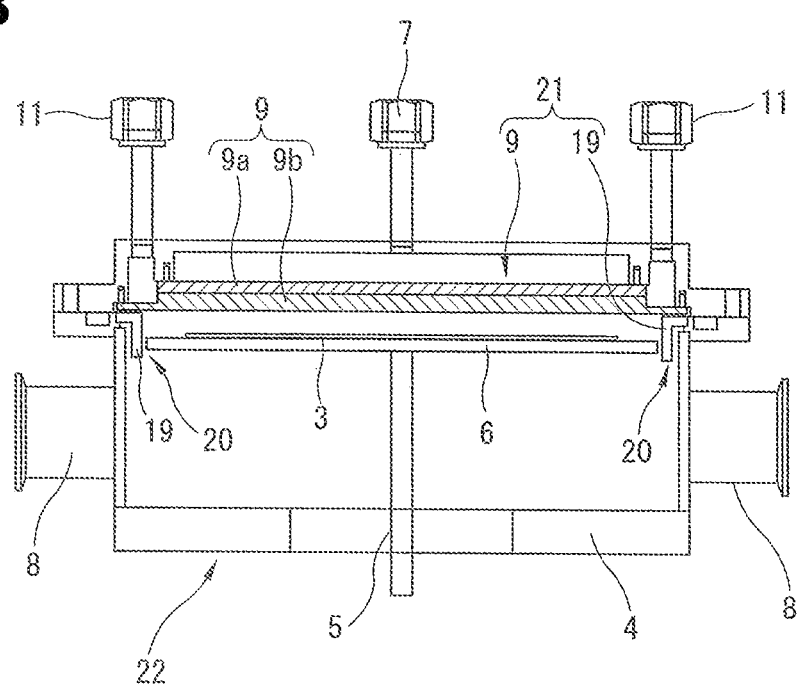
FIG. 8 is a sectional view of an ozone processing device provided with a shower head according to a sixth embodiment of the present invention.

FIG. 8 is a sectional view of an ozone processing device 22 provided with a shower head 21 according to a sixth embodiment of the present invention. The shower head 21 according to the sixth embodiment is one in which an exhaust characteristic control plate 19 similar to that in the fifth embodiment is provided to the shower head 9 according to the second embodiment.

For example, the exhaust characteristic control plate 19 is provided to the outer peripheral portion of the surface of the shower head 9 which faces the wafer 3. In addition, the shower head 21 may be configured by providing the exhaust characteristic control plate 19 to the ceiling part of the processing chamber 4.

According to the shower head 21 according to the sixth embodiment, in addition to the effect obtained in the shower head 9 according to the second embodiment, by providing the exhaust characteristic control plate 19, the pressure on the whole surface of the wafer 3 can be further equalized.

Figure 9A:
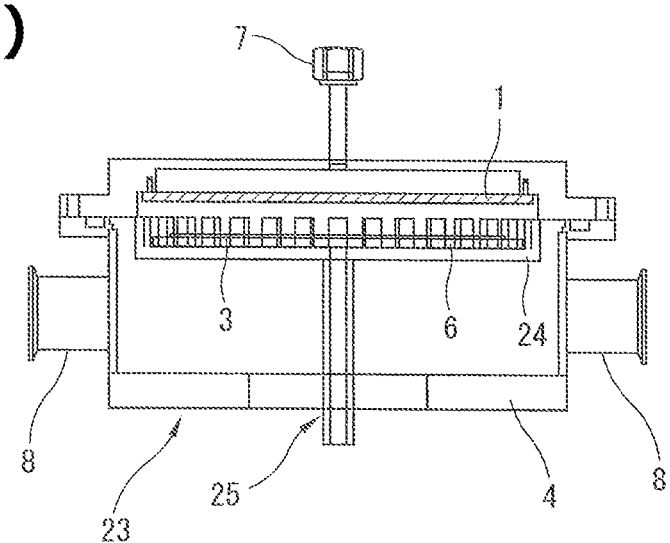
FIG. 9 (*a*) is a sectional view of an ozone processing device according to a seventh embodiment of the present invention, FIG. 9 (*b*) is a plane view of a rotation slit, and FIG. 9 (*c*) is a side view of the rotation slit.
Figure 9B:
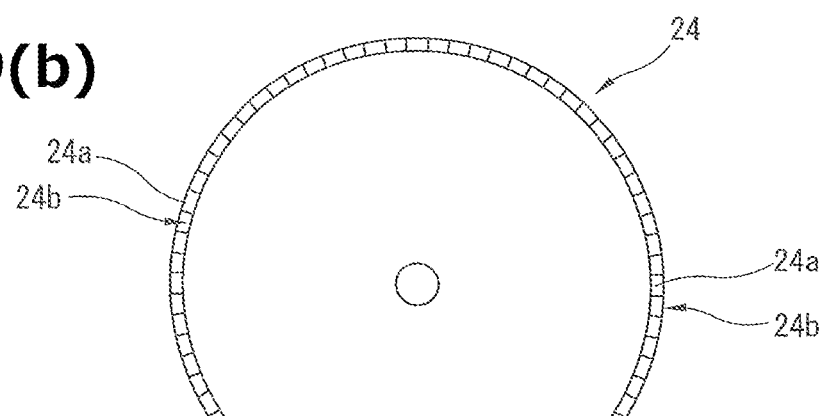
Figure 9C:
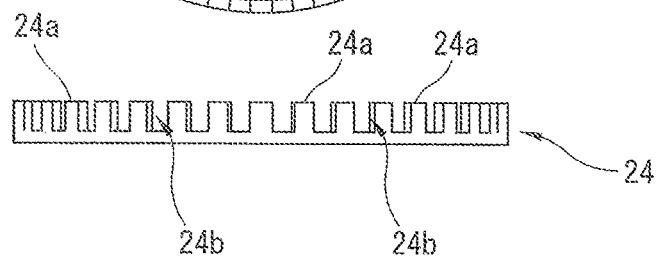

FIG. 9 (a) is a sectional view of an ozone processing device 23 according to a seventh embodiment of the present invention. The ozone processing device 23 according to the seventh embodiment is one in which a rotation slit 24 is provided to the ozone processing device 2 according to the first embodiment. The configuration of the ozone processing device 23 different from that of the ozone processing device 2 according to the first embodiment will be explained in detail.

The rotation slit 24 and the rotation stage 6 (and a susceptor) are rotatably supported on a biaxial rotation introducing machine 25. The rotation stage 6 is attached to the first stage of the rotation introducing machine 25, and the rotation slit 24 is attached to the second stage of the rotation introducing machine 25.

By the rotation introducing machine 25, the rotation stage 6 and the rotation slit 24 are rotated at different speeds, and the gas supplied to the wafer 3 is exhausted through the rotation slit 24. Therefore the flow of the gas exhausted from the outer peripheral portion of the shower head 1 is disturbed by the rotation slit 24, and it becomes random exhaust. Although, since the gas supplied to the wafer 3 is exhausted through the rotation slit 24, the exhaust characteristic slightly deteriorates, it is possible to stir the gas supplied to the wafer 3.

As shown in FIG. 9 (b) and FIG. 9 (c), the rotation slit 24 is provided with wall portions 24a standing in the normal direction of the processing surface of the wafer 3. The wall portions 24a are provided with a predetermined distance so as to surround the outer periphery of the rotation stage 6, and slits 24b are formed between the wall portions 24a.

According to the ozone processing device 23 according to the seventh embodiment, in addition to an effect obtained in the shower head 1 (and the ozone processing device 2) according to the first embodiment, the stirring of the gas supplied to the wafer 3 can be carried out.

Figure 10:
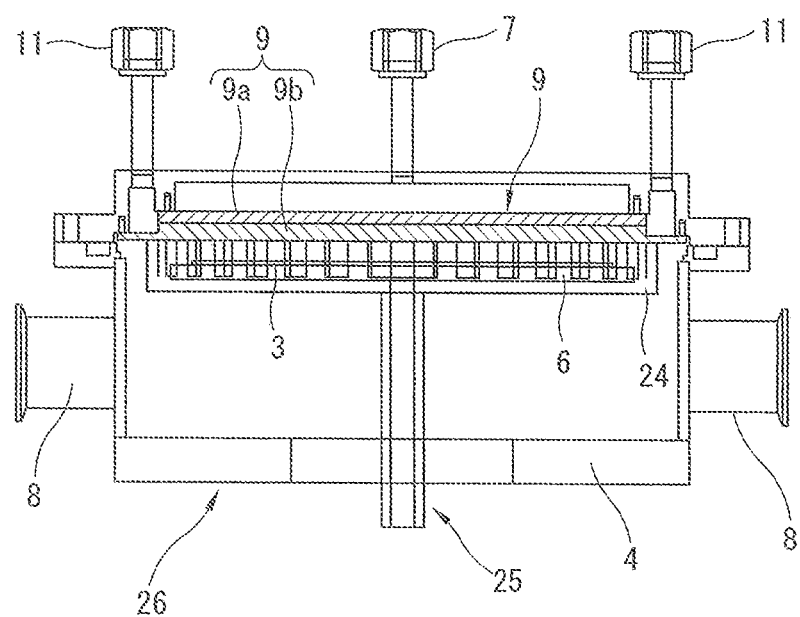
FIG. 10 is a sectional view of an ozone processing device according to an eighth embodiment of the present invention.

FIG. 10 is a sectional view of an ozone processing device 26 according to an eighth embodiment of the present invention. The ozone processing device 26 according to the eighth embodiment is one in which a rotation slit 24 similar to that in the seventh embodiment is provided to the ozone processing device 10 according to the second embodiment.

According to the ozone processing device 26 according to the eighth embodiment, in addition to the effect obtained in the shower head 9 (and the ozone processing device 10) according to the second embodiment, by providing the rotation slit 24, the stirring of the gasses supplied to the wafer 3 can be carried out.

A working effect of the shower head and the ozone processing device according to the embodiments of the present invention will be explained with reference to FIG. 11 to FIG. 13. In characteristic diagrams shown in FIG. 11 (a), FIG. 12 (a) and FIG. 13 (a), each pressure (Pa, Pc, Pe) is represented by a ratio to an exhaust port pressure (Pe) when a gas flow rate is 50 sccm (sccm: 1 atm (1013 hPa), ccm ($cm^3$/min) at 25° C.). In addition, the positions at which the respective pressures (Pa, Pc, Pe) are measured are roughly shown in each of the ozone processing devices 2, 18 and 27 respectively shown in FIG. 11 (b), FIG. 12 (b) and FIG. 13 (b).

Figure 11A:
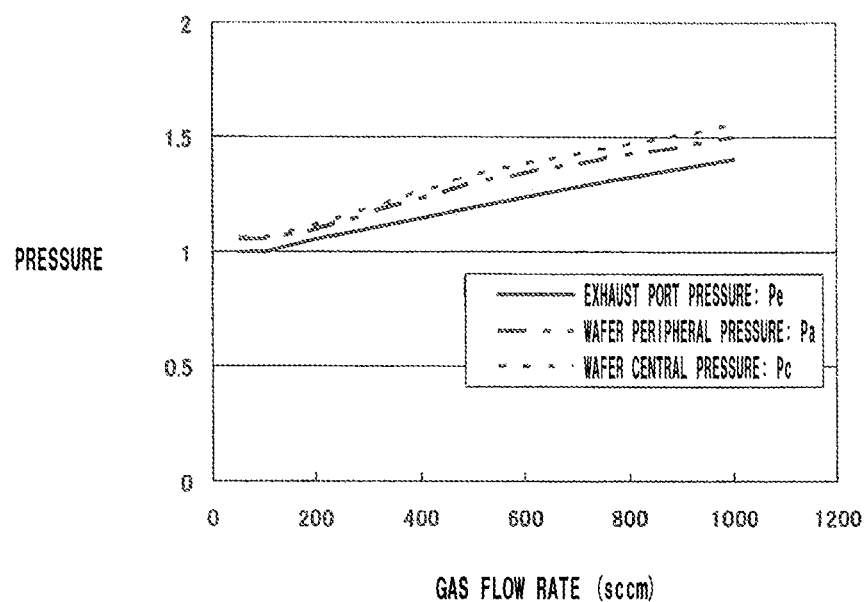
FIG. 11 is an explanatory drawing to explain an effect of the shower head according to the first embodiment, and FIG. 11 (*a*) is a characteristic diagram showing the relationship between a gas flow rate and a pressure obtained by a difference in pressure measurement positions, and FIG. 11 (*b*) is an explanatory view to explain the pressure measurement positions.
Figure 11B:
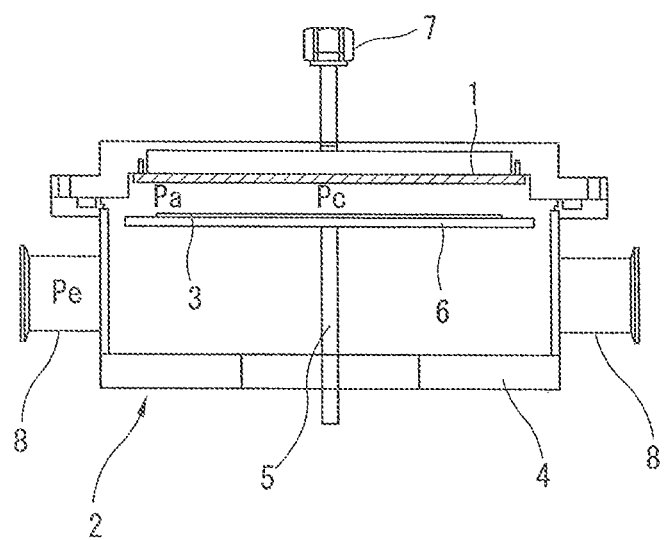

FIG. 11 (a) is a characteristic diagram showing the relationship between a gas supply flow rate and each of the pressure (Pc) in the center of the wafer 3, the pressure (Pa) at the periphery of the wafer 3 and the pressure (Pe) in the exhaust port 8 of the ozone processing device 2 according to the first embodiment.

Figure 12A:
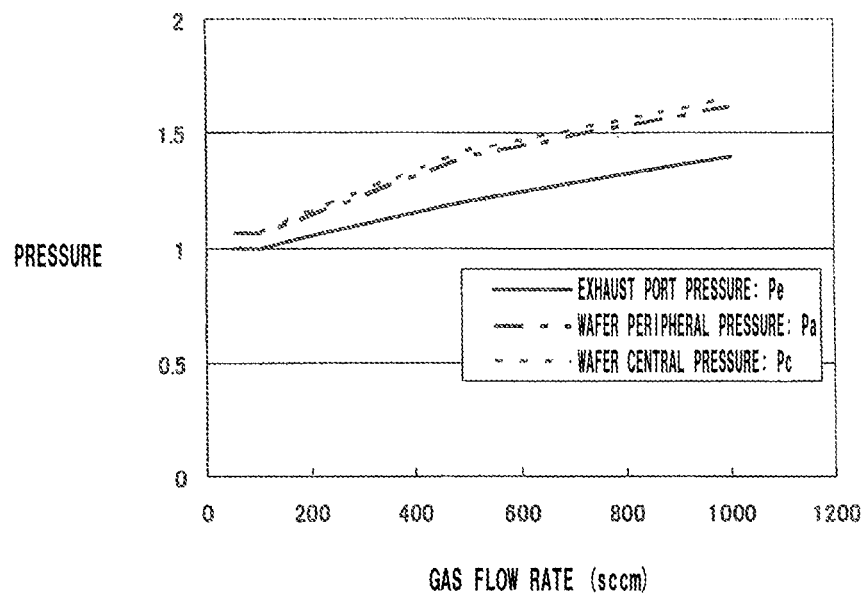
FIG. 12 is an explanatory drawing to explain an effect of the shower head according to the fifth embodiment, and FIG. 12 (*a*) is a characteristic diagram showing the relationship between a gas flow rate and a pressure obtained by a difference in pressure measurement positions, and FIG. 12 (*b*) is an explanatory view to explain the pressure measurement positions.
Figure 12B:
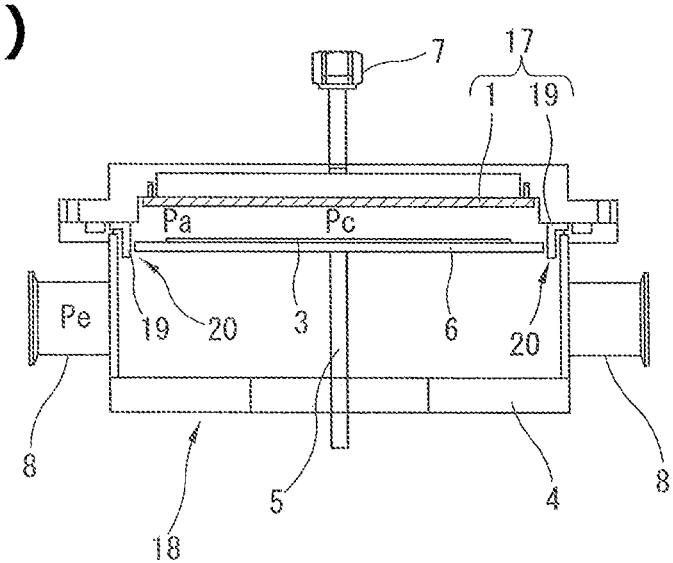

FIG. 12 (a) is a characteristic diagram showing the relationship between a gas supply flow rate and each of the pressure (Pc) in the center of the wafer 3, the pressure (Pa) at the periphery of the wafer 3 and the pressure (Pe) in the exhaust port 8 of the ozone processing device 18 according to the fifth embodiment.

Figure 13A:
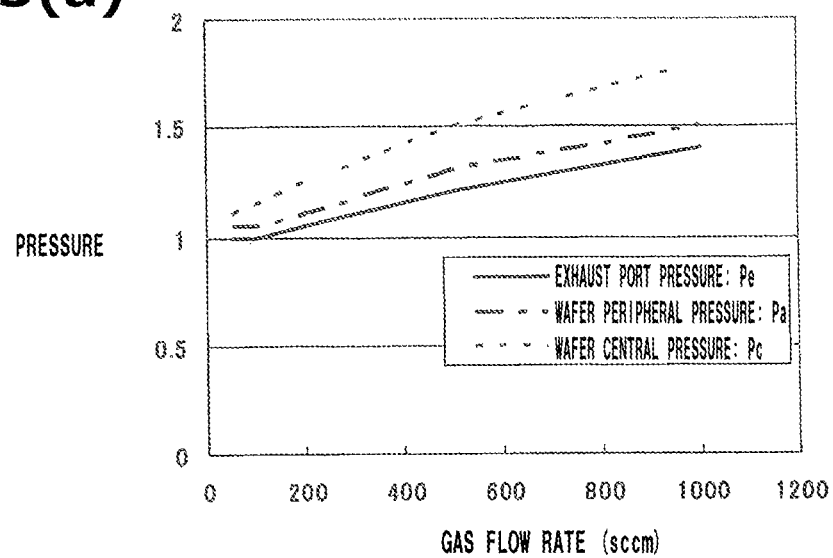
FIG. 13 is an explanatory drawing to explain an effect of a shower head according to a comparative embodiment, and FIG. 13 (*a*) is a characteristic diagram showing the relationship between a gas flow rate and a pressure obtained by a difference in pressure measurement positions, FIG. 13 (*b*) is a sectional view of an ozone processing device according to a comparative embodiment, and FIG. 13 (*c*) is a plane view of the shower head according to the comparative embodiment.
Figure 13B:
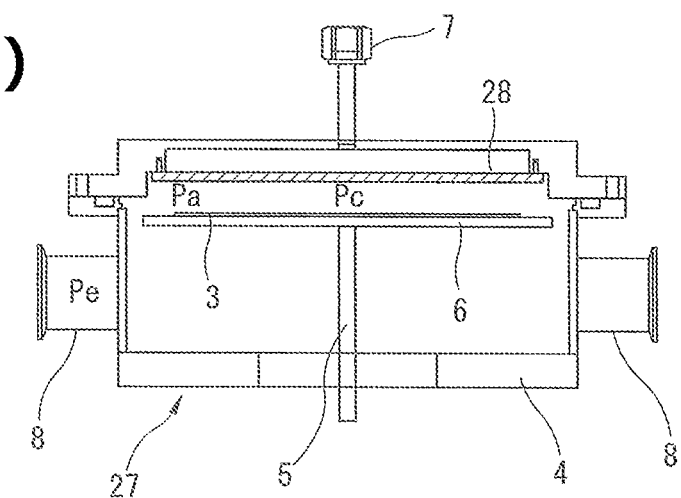
Figure 13C:
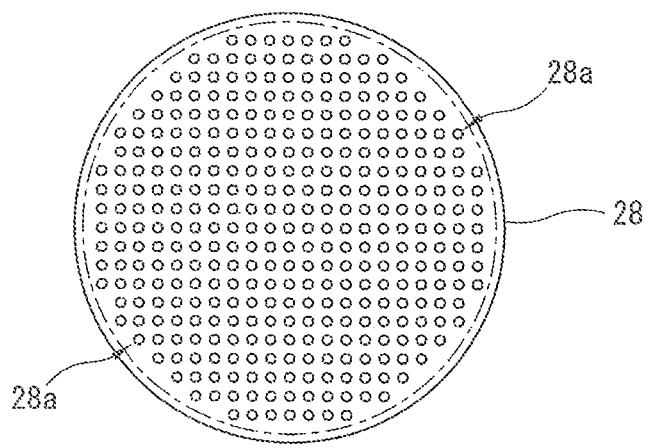

FIG. 13 (a) is a characteristic diagram showing the relationship between a gas supply rate and each of the pressure (Pc) in the center of the wafer 3, the pressure (Pa) at the periphery of the wafer 3 and the pressure (Pe) in the exhaust port 8 of the ozone processing device 27 according to the comparative embodiment. As shown in FIG. 13 (b), the ozone processing device 27 according to the comparative embodiment is one provided with a shower head 28 according to the comparative embodiment. As shown in FIG. 13 (c), gas injection holes 28a are uniformly formed on the surface of the shower head 28 which faces the wafer 3.

As is clear from the comparison between the characteristic diagram (shown in FIG. 11 (a)) of the ozone processing device 2 according to the first embodiment and the characteristic diagram (shown in FIG. 13 (a)) of the ozone processing device 27 according to the comparative embodiment, in the ozone processing device 2 according to the first embodiment, there is almost no difference in pressure between around the center and around the periphery of the surface of the wafer 3. Therefore, in the ozone processing device 2 according to the first embodiment, the gas supply pressure (that is, a supply rate of the gas to be supplied from the shower head 1) on the whole surface (in the central part and the peripheral part) of the wafer 3 is equalized, and thereby ozone processing can be further uniformly performed to the whole surface of the wafer 3. In addition, since the wafer 3 is placed on the rotation stage 6, by rotating the wafer 3, ozone processing can be equally carried out to the whole surface of the wafer 3.

Similarly, as shown in FIG. 12 (*a*), also in the ozone processing device 18 according to the fifth embodiment, there is almost no difference in gas supply pressure between around the center and around the periphery of the surface of the wafer 3. In particular, as compared with the characteristic diagram of the ozone processing device 2 according to the first embodiment which is shown in FIG. 11 (*a*), in the ozone processing device 18 according to the fifth embodiment, since the exhaust characteristic on the surface of the wafer 3 deteriorates, the pressures (Pc, Pa) around the center and around the periphery of the surface of the wafer 3 are increased. However, in the ozone processing device 18 according to the fifth embodiment, as compared with the ozone processing device 2 according to the first embodiment, the difference in pressure between around the center and around the periphery of the whole surface of the wafer 3 becomes small. Therefore, in the ozone processing device 27 according to the fifth embodiment, the gas supply pressure (that is, a supply rate of the gas to be supplied from the shower head 17) of the whole surface (in the central part and at the peripheral part) of the wafer 3 is further equalized, and thereby ozone processing can be further uniformly carried out to the whole surface of the wafer 3.

According to the ozone processing device 2 (the ozone processing devices 10, 13, 16, 18, 22, 23, 26 according to the other embodiments are also the same. The same shall apply hereinafter) and the shower head 1 (the shower heads 9, 12, 15, 17 and 21 according to the other embodiments are also the same. The same shall apply hereinafter) according to the first embodiment of the present invention mentioned above, by providing the exhaust gas flow path portions 1*b* to the surface of the shower head 1 in which the gas injection holes 1*a* are formed, areas from which gas is not supplied and which extend in the radial direction of the wafer 3 are formed. Consequently, the gas (gasses such as a material gas, an added gas and oxygen produced after the reaction) supplied to the wafer 3 quickly passes through the spaces between the exhaust gas flow path portions 1*b* and the wafer 3, and is exhausted, and thereby the difference in gas supply pressure between around the center and around the periphery of the wafer 3 can be made almost zero. That is, the pressure difference between the shower head 1 and the wafer 3 in the horizontal direction of the processing surface of the wafer 3 can be reduced. In addition, since the wafer 3 is placed on the rotation stage 6, by rotating the wafer 3, ozone processing can be equally performed to the whole surface of the wafer 3. In particular, even in a case where the shower head 1 is provided so as to be close to the processing surface of the wafer 3, for example, even in a case where the distance between the gas injection surface of the shower head 1 and the processing surface of the wafer 3 is shorter than the shortest distance between gas injection holes 1*a* formed to the shower head 1, since exhaust flow paths having the same width as the exhaust gas flow path portions 1*b* are formed from the central part of the shower head 1 toward the exhaust direction, the gas supplied to the wafer 3 can be quickly exhausted.

In the ozone processing device 27 according to the comparative embodiment shown in FIG. 13 (*b*), the exhausting of the gas injected to the central part of the wafer 3 is inhibited by the gas injected to a part other than the central part of the wafer 3 as the distance between the wafer 3 and the shower head 28 becomes small, and, as compared with the gas injected to the peripheral part of the wafer 3, the gas injected to the central part is hard to be exhausted. Therefore the pressure difference is generated between in the central part and at the peripheral part on the surface of the wafer 3 (pressure in the central part>pressure at the peripheral part), and a high-concentration ozone gas is hard to be supplied to the central part of the wafer 3 and is easy to be supplied to the peripheral part of the wafer 3 at which the exhausting is quickly performed and the pressure is low. Consequently, the quantity of a high-concentration ozone gas having high reactivity to be supplied from the shower head 28 to the wafer 3 becomes large at the peripheral part of the wafer 3 at which the pressure is low. Therefore, an ozone processing effect at the periphery of the wafer 3 is increased, and the uniformity of the ozone processing performed to the whole surface of the wafer 3 becomes low.

In addition, in a case where a high-concentration ozone gas is supplied from the shower head 28 to the wafer 3, if the ozone gas is reacted once, then becomes oxygen gas, high reactivity of ozone gas is eliminated. Therefore, it also becomes important to quickly exhaust the oxygen gas after the reaction from the wafer 3 and to supply a high-concentration ozone gas to the wafer 3.

In consideration of such a problem, according to the ozone processing device 2 and the shower head 1 according to the embodiments of the present invention, the ozone gas (containing oxygen gas produced after reaction) supplied to the central part of the wafer 3 is quickly exhausted through between the exhaust gas flow path portions 1*b* and the wafer 3, and thereby a high-concentration ozone gas can be always supplied to the surface of the wafer 3 at a constant gas pressure. Therefore, high reactivity of a high-concentration ozone gas can be effectively acted to the whole surface of the wafer 3, and, in various oxidation processes in which high reactivity of a high-concentration ozone gas is used, an equal processing can be performed to a large ozone-processing object (for example, the wafer 3 and a glass board).

In addition, in a case where a shower head for a plurality of gasses (two or more gasses) which is capable of simultaneously supplying a high-concentration ozone gas and a gas having high reactivity (hereinafter is referred to as an added gas) is used in order to improve the reactivity of the high-concentration ozone gas, there is a case where the pressure of the added gas other than the high-concentration ozone gas is high, and if the gas in the central part of the wafer 3 is not quickly exhausted as mentioned above, due to the influence of the gas pressure of the added gas or the gas pressure generated by the reaction of the ozone gas and the added gas, the high-concentration ozone gas is further hard to be supplied to the central part of the wafer 3, and then unevenly supplied to the peripheral part of the wafer 3.

In consideration of such a problem, according the ozone processing device 10 (the ozone processing devices according to the other embodiments are also the same. The same shall apply hereinafter) and the shower head 9 (the shower heads according to the other embodiments are also the same. The same shall apply hereinafter) according to the second embodiment, the pressure difference between the shower head 9 and the wafer 3 in the horizontal direction of the processing surface of the wafer 3 is reduced, and thereby a uniform processing can be performed to the whole surface of the wafer 3. That is, according to the ozone processing device 10 and the shower head 9 according to the second embodiment, in a case where different kinds of a plurality of gasses are supplied from the shower head 9 to the wafer 3, it is suppressed that a part of the gasses is unevenly supplied to the wafer 3 due to the pressure difference between the gasses, and thereby the processing can be further uniformly performed.

In addition, by providing the exhaust direction control plates 14 explained in the third and fourth embodiments, the flow direction of the exhaust gas flowing between the shower head 1 or 9 and the wafer 3 is controlled, and thereby the gas supplied to the wafer 3 can be further quickly exhausted to the outside of the processing chamber 4.

In addition, by providing the exhaust characteristic control plate 19 explained in the fifth and sixth embodiments, although the pressure loss of the gas to be exhausted from the wafer 3 occurs and an exhaust characteristic slightly deteriorates, the pressure on the whole surface of the wafer 3 can be further uniformized.

In addition, by providing the rotation slit 24 explained in the seventh and eighth embodiments, although the exhaust characteristic of the gas to be exhausted from the wafer 3 slightly deteriorates, the gas becomes random exhaust by the rotation slit 24, and thereby the gas can be stirred.

As the above, although the shower head and the processing device of the present invention have been explained while showing the specific embodiments, the shower head and the processing device of the present invention are not limited to the embodiments, and design change can be appropriately performed in a range not impairing its characteristic, and ones in which the design change has been performed belong to the technical scope of the present invention.

For example, a shower head and a processing device including a part of the configuration of the ozone processing device explained in the embodiments of the present invention or a shower head and a processing device combining a part of the configuration of the ozone processing device explained in the embodiments of the present invention belong to the technical scope of the present invention.

In addition, the processing device is not limited to a device for oxidation-processing the wafer 3 with ozone, and the present invention can be applied to a device which supplies a gas from a shower head to an object to be processed.

Therefore, the processing object is not limited to the wafer 3, and a glass board, a board made of resin, a resin film and the like can be applied. That is, in a field of a silicon semiconductor, a circular board used in the embodiments is used as an object to be processed, and in a field of a display, an object to be processed, such as a rectangular board, is used according to a purpose. In addition, the shower head and the processing device of the present invention can be also applied to not only a processing device for processing a fixed board by supplying a gas to the board but also a processing device for supplying a gas to a film which moves by a roll-to-roll method.

In addition, as a processing device using a high-concentration ozone gas, a processing device is cited which uses a high-concentration ozone gas as an oxidizing agent in various processes, such as wafer washing, the formation for an oxidation film of silicone oxidation (for example, Japanese Patent Application Publication H08-335576), CVD, ALD (Atomic Layer Deposition) and ashing. By applying the shower head and the processing device of the present invention to the device, an ozone processing having excellent in-plane uniformity can be performed to an object to be oxidized. For example, in a case where ashing (etching) or cleaning is performed by using ozone gas, unsaturated hydrocarbon gas is supplied from the first gas injection holes of the shower head, and ozone gas is supplied from the second gas injection holes of the shower head. In addition, in a case where film deposition such as CVD is performed, in a state in which ozone is filled in a processing furnace in advance, TEOS gas (material gas for forming a $SiO_2$ film) or TMA (trimethylaluminium, material gas for forming an $Al_2O_3$ film) is supplied from the first gas injection holes of the shower head, and unsaturated hydrocarbon is supplied from the second gas injection holes of the shower head. Moreover, in addition to a material gas containing Al element, such as TMA, a gas containing organic metals (for example, Hf, Zn, Zr and Ti) is used according to a purpose (for, for example, an optical thin film, a transparent conductive film and a dielectric film). In this way, the gasses to be supplied from the shower head are arbitrary gasses selected according to a purpose, and ozone gas may not always be included.

In addition, even in a case where three or more kinds of gasses are supplied from the shower head, an effect obtained in the shower head and the processing device of the present invention can be also obtained. That is, if the gas to be supplied from the shower head to the wafer is one or more kinds of gasses, an arbitrary gas can be supplied from the shower head to the wafer. In addition, a plurality of gasses are mixed in a stage before being supplied from the shower head, and then the mixed gas can be supplied from the shower head to the wafer.

In addition, the number of the exhaust gas flow path portions 1$a$, 9$d$ and 9$g$ are not limited to the embodiments, and a plurality of the exhaust gas flow path portions are formed according to an processing device.

The invention claimed is:

1. A shower head for supplying a gas to an object to be processed, comprising:
    a plurality of gas injection holes on a side facing the processing object of the shower head,
    wherein a plurality of areas in which the gas is not injected are provided on a surface facing the processing object of the shower head so as to extend from an outer peripheral part of the shower head toward a central part of the shower head,
    wherein the gas injection holes are formed in each of areas disposed between the areas in which the gas is not injected,
    wherein exhaust direction control plates extending from the central part of the shower head toward the outer peripheral part of the shower head are vertically provided on the side facing the processing object of the shower head, and
    wherein the exhaust direction control plates are provided between exhaust gas flow path portions adjacent to each other in a circumferential direction of the shower head.

2. The shower head according to claim 1, wherein the gas contains different kinds of a plurality of gasses, and
    wherein gas injection holes for supplying different kinds of the respective gasses are provided on the side facing the processing object of the shower head.

3. The shower head according to claim 1, wherein an exhaust characteristic control plate vertically provided along an outer periphery of the shower head is provided on the side facing the processing object of the shower head.

4. A processing device comprising:

a processing chamber in which an object to be processed is disposed;

a stage which is provided in the processing chamber and on which the processing object is placed; and a shower head for supplying a gas to the processing object, the shower head being provided so as to face the processing object placed on the stage, wherein a plurality of areas in which the gas is not injected are provided on a surface facing the processing object of the shower head so as to extend from an outer peripheral part of the shower head toward a central part of the shower head, wherein a plurality of gas injection holes from which the gas is injected are formed in each of areas disposed between the areas in which the gas is not injected, wherein exhaust direction control plates extending from the central part of the shower head toward the outer peripheral part of the shower head are vertically provided on a side facing the processing object of the shower head, and wherein the exhaust direction control plates are provided between exhaust gas flow path portions adjacent to each other in a circumferential direction of the shower head.

5. The processing device according to claim 4, wherein the gas contains different kinds of a plurality of gasses, and wherein gas injection holes for supplying different kinds of the respective gasses are provided on a side facing the processing object of the shower head.

6. The processing device according to claim 4, wherein an exhaust characteristic control plate vertically provided along an outer periphery of the shower head is provided to the shower head or the processing chamber.

7. The processing device according to claim 4, wherein the surface on the side facing the processing object of the shower head has a circular shape, wherein the processing chamber is provided with a plate formed with a slit from which the gas is exhausted, along an outer periphery of the shower head so as to face a side surface of the processing object, and wherein the plate formed with the slit is rotatably supported about a center of the surface on the side facing the processing object of the shower head.

* * * * *